United States Patent [19]
Roberts

[11] Patent Number: 5,981,112
[45] Date of Patent: *Nov. 9, 1999

[54] METHOD OF MAKING COLOR FILTER ARRAYS

[75] Inventor: Luther C. Roberts, Rochester, N.Y.

[73] Assignee: Eastman Kodak Company, Rochester, N.Y.

[*] Notice: This patent is subject to a terminal disclaimer.

[21] Appl. No.: 08/976,337

[22] Filed: Nov. 21, 1997

Related U.S. Application Data

[63] Continuation-in-part of application No. 08/788,108, Jan. 24, 1997, Pat. No. 5,747,199, and a continuation-in-part of application No. 08/788,532, Jan. 24, 1997, Pat. No. 5,811,156, and a continuation-in-part of application No. 08/787,732, Jan. 24, 1997, Pat. No. 5,776,641, and a continuation-in-part of application No. 08/789,590, Jan. 24, 1997, Pat. No. 5,756,240.

[51] Int. Cl.[6] ............................. G02B 5/20; G02F 1/1335
[52] U.S. Cl. ............................... 430/7; 430/199; 503/227
[58] Field of Search ................................ 430/7, 199, 200, 430/201; 503/227; 427/162

[56] References Cited

U.S. PATENT DOCUMENTS

| | | | |
|---|---|---|---|
| 4,081,227 | 3/1978 | Brault et al. | 250/226 |
| 4,793,692 | 12/1988 | Kamio et al. | 349/106 |
| 5,747,199 | 5/1998 | Roberts et al. | 430/7 |
| 5,756,240 | 5/1998 | Roberts et al. | 430/7 |
| 5,776,641 | 7/1998 | Roberts et al. | 430/7 |
| 5,811,156 | 9/1998 | Roberts | 427/162 |

*Primary Examiner*—John A. McPherson
*Attorney, Agent, or Firm*—James D. Leimbach

[57] ABSTRACT

A method of making a color filter array on a first substrate comprising the steps of: providing at least one transferable colorant layer on a second substrate and positioning such transferable layers in transferable relationship with but spaced a distance from the first substrate; and heating the second substrate sufficiently to simultaneously transfer the colorant materials from the heat transferable colorant layers to the first substrate. Unwanted colorant is then removed by a lift-off process, by chemical mechanical polishing, or by etching, leaving behind the colorant materials in the position of the openings over selected regions.

54 Claims, 10 Drawing Sheets

METHOD OF MAKING COLOR FILTER ARRAYS

This is a Continuation-in Part of U.S. patent application Ser. No. 08/788,108, now U.S. Pat. No. 5,747,199 filed Jan. 24, 1997 by Roberts et al., entitled "Making Color Filter Arrays By Transferring Two Or More Colorants Simultaneously," U.S. patent application Ser. No. 08/788,532, now U.S. Pat. No. 5,811,156 filed Jan. 24, 1997 by Roberts, et al., entitled "A Method Of Making A Color Filter Array By Colorant Transfer And Etch,", U.S. patent application Ser. No. 08/787,732, now U.S. Pat. No. 5,776,641, filed Jan. 24, 1997 and entitled "Method of Making Color Filter Arrays By Colorant Transfer Using Chemical Mechanical Polishing," by Roberts, et al., and U.S. patent application Ser. No. 08/789,590, now U.S. Pat. No. 5,756,240 filed Jan. 24, 1997 by Roberts, et al., entitled "Making Color Filter Arrays By Transferring Colorant Material."

CROSS REFERENCE TO RELATED APPLICATIONS

The present invention is related to U.S. patent application Ser. No. 08/648,772 filed May 16, 1996, now U.S. Pat. No. 5,688,551, and entitled "Method of Forming an Organic Electroluminescent Display Panel," by Littman, et al. The disclosure of this related application is incorporated herein by reference.

FIELD OF THE INVENTION

The present invention relates to methods of making color filter arrays which are suitable for display applications such as liquid crystal displays or light emitting diode displays and are particularly suitable for use on image sensors.

BACKGROUND OF THE INVENTION

In making color filter arrays, separate layers of different colors must be formed. Frequently these layers are formed using dye as the colorant material which is imbibed into dye receiving layers which must be of a controlled thickness, and a precise amount of dye must be used to achieve the appropriate color. See, for example, commonly assigned U.S. Pat. No. 4,764,670 to Pace et al., U.S. Pat. No. 4,876,167 to Snow et al., and U.S. Pat. No. 5,576,265 to DeBoer et al. which describe such a process. An additional problem associated with this process is that the dye receiving layers swell upon the introduction of dyes, limiting the smallest dimension which can be attainable for use over very small filter elements. In addition, the dyes spread within the dye receiving layer, resulting in loss in edge sharpness of the filter elements. Another problem with this process is that dyes are susceptible to fading on exposure to light.

Figure 1:
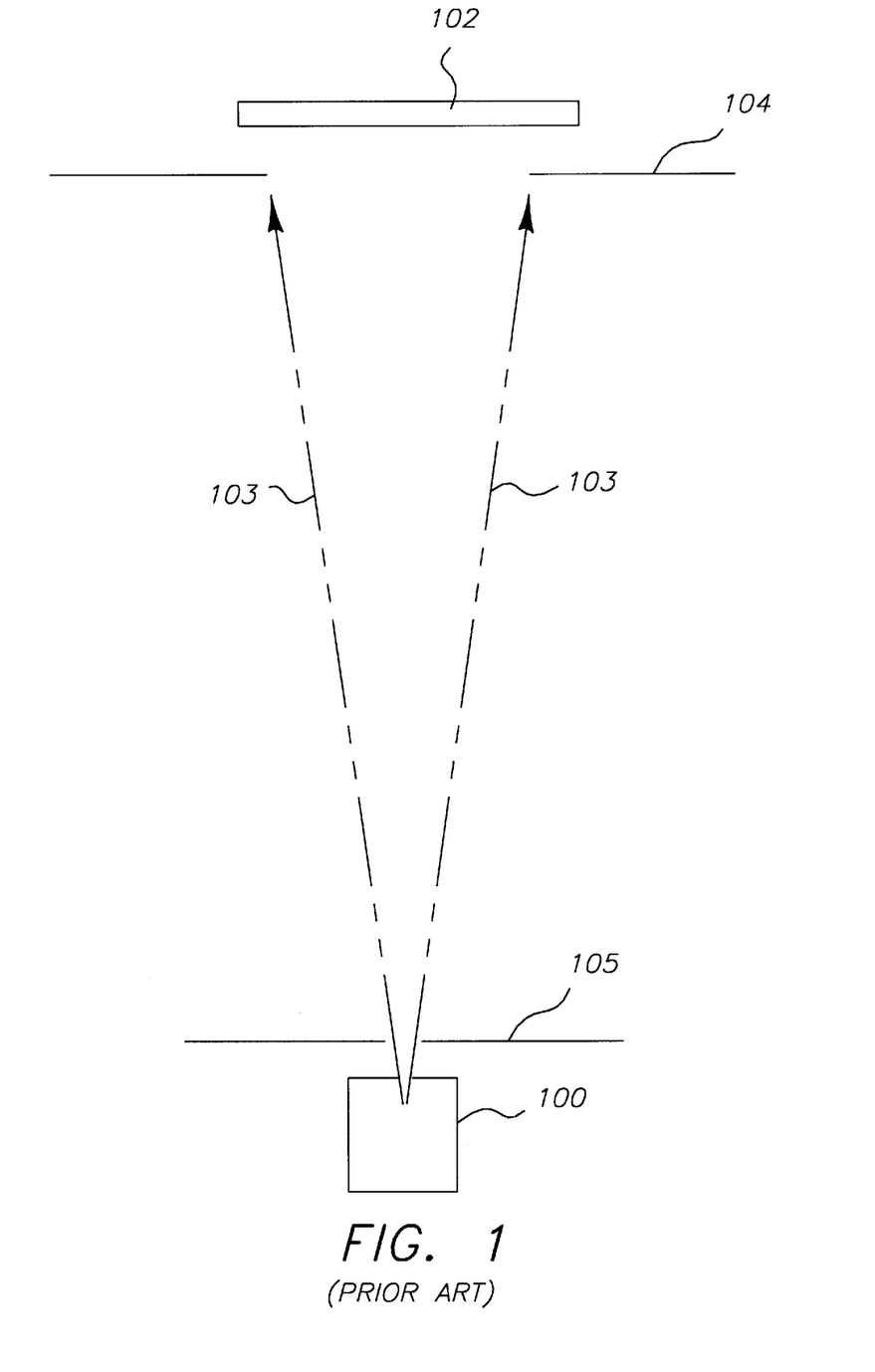
FIG. 1 shows a typical configuration for conventional physical vapor deposition (PVD).

Turning to FIG. 1, which shows a method for making coatings from evaporated organic colorants, a substrate 102 is positioned adjacent to an aperture mask 104. The aperture mask provides an aperture over a portion of the substrate. An organic colorant which is to provide the coating is placed into a source boat 100, which is heated by passing an electric current through it. Alternatively, the boat may be heated by the application of radiant heating from a suitably placed heat source. Upon being heated under reduced pressure, the colorant vaporizes and travels from the source, impinging on mask 105. The portion of colorant vapor which passes through the opening in mask 105 travels along the lines 103, and between those lines, depositing on the substrate 102 and mask 104.

There are a number of problems associated with this technique which involves depositing layers in a partial vacuum and is frequently referred to in the art as physical vapor deposition (PVD). In certain cases, it is difficult to control the thickness and uniformity of the colorant deposited on the substrate. The process of vacuum deposition of the colorant typically requires the use of an appropriate placement of sources or masks or moving substrate fixtures to produce a coating which is uniform. However, the colorant material may deposit on the mask and vacuum fixtures to such a degree that it flakes off, creating undesirable contamination and waste of the colorant, and requiring frequent clean-up. In addition, the moving fixtures may generate undesirable particulate materials which may cause contamination of the substrate.

Some other problems in making color filter arrays by the PVD process are the need to use a large source-to-substrate spacing which requires large chambers and large pumps to reach a sufficient vacuum, and the need for masks which cause low-material utilization and build-up on the mask with the concomitant contamination problems. Very specific off-axis source location relative to the substrate, which is sometimes needed for uniform coating, causes very poor material utilization. Still further, source replenishment problems exist for coating multiple substrates in one pump-down. In addition, when multiple layers are deposited, the process needs to be carefully monitored for the thickness of layers in the multiple colorant coatings in multiple cycles.

SUMMARY OF THE INVENTION

It is an object of the present invention to provide an improved method for making color filter arrays which obviates the above difficulties, provides uniform colorant over the substrate, and is of low cost and high quality.

The present invention provides in one embodiment a method of making a color filter array on a first substrate comprising the steps of:

a) depositing and patterning a photoresist layer on the first substrate to form openings over selected regions in the first substrate;

b) providing one or more heat transferable colorant layers with heat transferable colorant materials on a second substrate and positioning the second substrate such that the heat transferable colorant layers are in transferable relationship with but spaced a distance from the first substrate;

c) heating the second substrate sufficiently to cause substantially all of the heat transferable colorant materials to simultaneously transfer across the spaced distance to the patterned resist layer on the first substrate; and d) removing the patterned photoresist layer and the overlying colorant layers, leaving behind the colorant materials in the position of the openings over the selected regions.

In another embodiment, the present invention provides a method of making a color filter array on a first substrate comprising the steps of:

a) depositing and patterning a photoresist layer on the first substrate to form openings over selected regions of the substrate;

b) etching through the openings in the patterned photoresist layer, using it as a mask, to form a pattern of recesses in the first substrate;

c) providing one or more transferable colorant layers having a heat transferable colorant material on a second substrate and positioning the second substrate such that the heat transferable colorant layer is in transferable relationship with, but spaced a distance from, the first substrate;

d) heating the second substrate sufficiently to cause substantially all of the heat transferable colorant material to transfer across the spaced distance to the patterned photoresist layer on the first substrate;

e) removing the patterned photoresist layer and colorant layer, leaving behind the heat transferable colorant material in the position of the openings over the selected regions of the first substrate.

In yet another embodiment the present invention provides a method of making a color filter array on a first substrate comprising the steps of:

a) depositing and patterning a first photoresist layer on the first substrate to form a plurality of openings over selected regions of the first substrate;

b) etching through the openings in the first patterned photoresist layer, using it as a mask, to form a pattern of recesses in the first substrate;

c) depositing and patterning a second photoresist layer on the first photoresist layer to form openings over the etched recesses above second selected regions of the first substrate;

d) providing at least one heat transferable colorant layers having heat transferable colorant material on a second substrate and positioning the second substrate such that the heat transferable colorant layers are in transferable relationship with but spaced a distance from, the first substrate;

e) heating the second substrate sufficiently to cause substantially all of the heat transferable colorant materials to transfer across the spaced distance to the second patterned photoresist layer on the first substrate; and f) removing both of the patterned photoresist layers and the overlying colorant layer, leaving behind the colorant materials in the position of the openings over the second selected pixels.

Still another embodiment of the present invention provides a method of making a color filter array on a first substrate comprising the steps of:

a) providing at least one heat transferable colorant layer having heat transferable colorant materials on a second substrate and positioning the second substrate such that the heat transferable colorant layers are in transferable relationship with but spaced a distance from the first substrate;

b) heating the second substrate sufficiently to cause substantially all of the heat transferable colorant materials to transfer across the spaced distance to the first substrate c) depositing and patterning a photoresist layer on the heat transferable colorant layers on the first substrate to form openings in the photoresist which are positioned over selected regions of the first substrate; and d) etching the heat transferable colorant layers on the first substrate through the openings in the patterned photoresist, leaving a behind a portion of the heat transferable colorant layers over the selected regions in the first substrate.

Advantages

Advantages of this technique include the ability to form colorant layers with tuned colors by co-deposition of a plurality of colorant materials in a single step, along with the ability to pattern the colorant layers to form an array of colorant elements. In addition, it provides for an evaporative purification of the colorant during the preparation of the transferable colorant coating and the effective utilization of evaporant materials with high quality uniformity over a large areas. Other advantages include precise control of layer thickness, lower maintenance of deposition vacuum chambers, and minimal monitoring for the deposition process. Still further, it offers the ability to coat at higher pressures and in smaller vacuum chambers which permit faster cycle time and the use of lower-cost vacuum equipment than for standard PVD techniques.

BRIEF DESCRIPTION OF THE DRAWINGS

It will be understood that the drawings are not to scale and have been shown for clarity of illustration.

DETAILED DESCRIPTION OF THE INVENTION

Turning first to FIG. 1, an arrangement for conventional PVD is shown, including a heated source 100, containing the material to be deposited, the substrate 102, and masks 104 and 105 which restrict the material vapor to paths 103 and the region in between.

Figure 2:
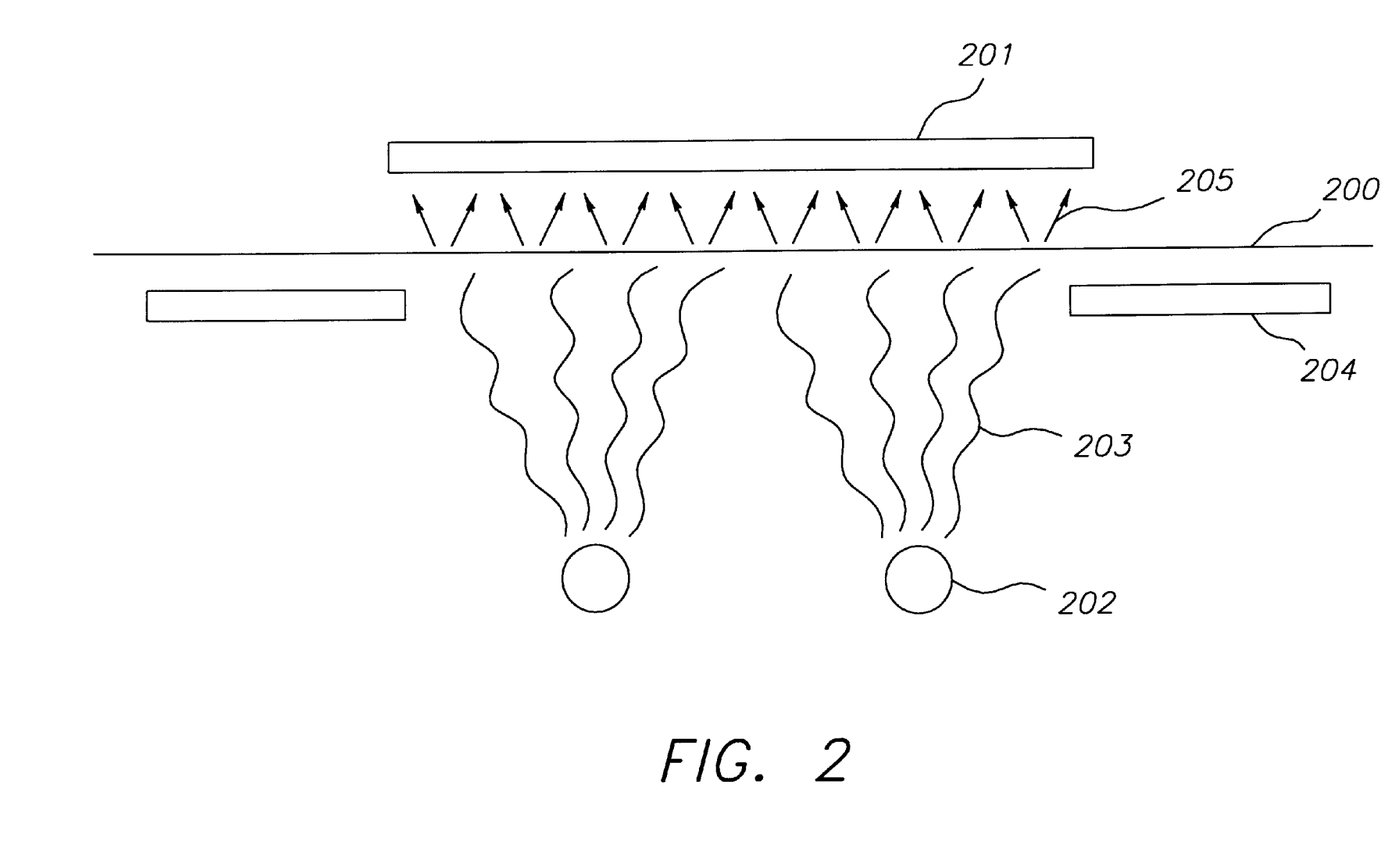
FIG. 2 shows a typical configuration for the thermal transfer of a material from an intermediate substrate to the final substrate, according to the present invention.

In FIG. 2 is shown a configuration for the transfer of a material which has been deposited as a coating on the second substrate 200, onto the first substrate 201 as indicated by the arrows 205 and which is promoted by heating with heat source 202 as indicated by radiant heat 203 acting through an aperture 204.

Color filter arrays may be fabricated using evaporated colorants which do not involve any receiving polymer. In order to fabricate such color filter arrays, a typical process is as follows: A photoresist layer is coated on a transparent substrate such as glass which is to be incorporated as an optical element in a device, for example in a liquid crystal display, a light emitting diode display, an imaging sensor, or other such device. Thereafter, the substrate is patterned to form openings over the regions which are to pass filtered light or light which is to be filtered, depending on the relative orientation of the substrate and the light source. Colorant materials, generally pigments, are then deposited over the patterned photoresist layer to form a colorant layer in the openings over the substrate. The unwanted colorant is removed by chemical mechanical polishing, in which particles of an abrasive substance such as silica with mean diameters of less than 0.5 micrometers are suspended in a fluid medium such as aqueous tetramethylammonium hydroxide and the surface to be polished is moved in relation to a pad which is wetted with the suspension. The colorant which is positioned over the selected regions is not removed due to its lower profile relative to the surface of the unwanted colorant. Alternatively, the unwanted colorant may be removed by lifting-off the patterned photoresist layer and the overlying colorant layer.

Color filter arrays may also be fabricated in another process, using evaporated colorants which do not involve any receiving polymer. In order to fabricate such color filter arrays on a substrate, such as an image sensor or on a transparent substrate, a typical process is as follows: A colorant or a plurality of colorants, generally pigments, is deposited on a substrate. Thereafter, a photoresist layer is coated on the colorant layer and then patterned to leave photoresist in place over selected regions of the substrate through which is to pass filtered light or light which is to be filtered. An etch process is now performed and the patterned photoresist layer acts as a mask for the colorant layer, such that the colorant is removed except over the selected regions.

Figure 3A:
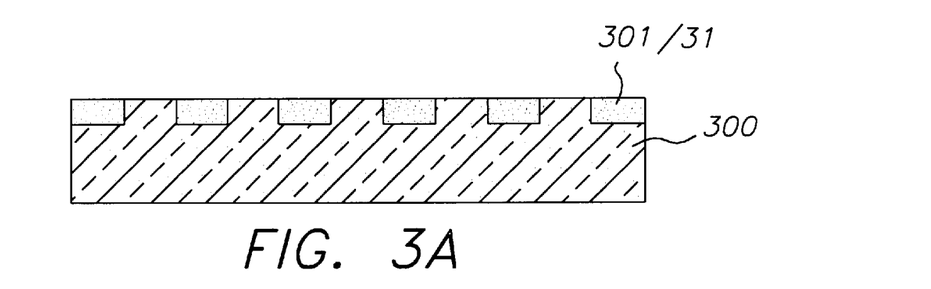
FIGS. 3A–H show various steps in a method according to the present invention for making color filter arrays.

Turning next to FIG. 3A where substrate 300 is shown, the substrate, which may be a transparent substrate such as glass, is shown with regions 31 through which pass filtered light or light which is to be filtered, depending upon the orientation of the substrate relative to the light source. The regions 31 in a transparent substrate may actually extend to include the full thickness of the substrate, and are not limited to only a portion of that thickness. For a silicon based substrate which are to receive light, regions 31 can be processed beforehand to provide wells for different dopant materials to form pixels 301. As is well understood to those skilled in the art, the substrate may be a composite of different layers and in particular may include an adhesion promoting layer 302.

Figure 3B:
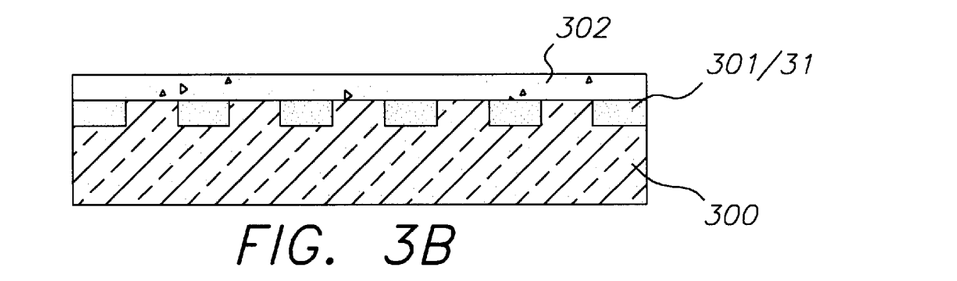

As shown in FIG. 3B, an adhesion-promoting layer 302 is formed as part of the substrate 300 and above regions 31 (or in pixels 301 in a silicon based substrate). The adhesion-promoting layer 302 can be formed by a number of techniques including spin-coating of an organic polymer or a spin-on glass, or by chemical vapor deposition. The adhesion promoting layer may be patterned to form recesses in the adhesion promoting layer above the pixels. Alternatively, the adhesion-promoting layer 302 may be applied after formation of the patterned photoresist layer 303, discussed below in FIG. 3C.

Figure 3C:
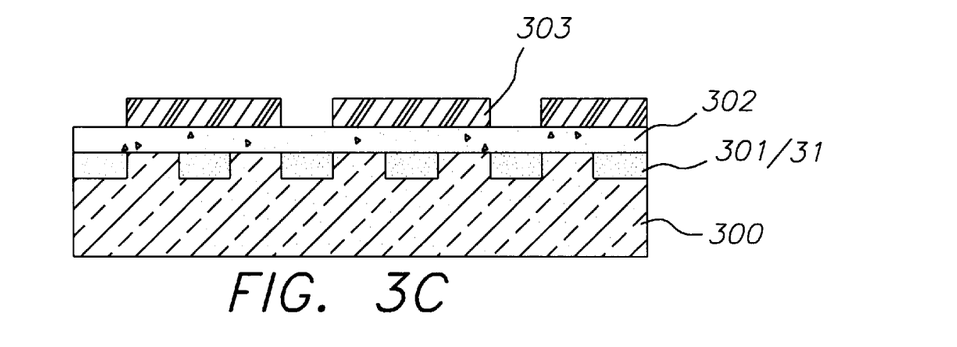

As shown in FIG. 3C, a spin-coated photoresist layer is patterned to provide openings over the selected regions 31 (which can be pixels 301). Such patterning techniques are well known to those skilled in the art. Typically, the photoresist layer can be imagewise exposed to light, illuminating particular areas of the layer. A development step is then used to form openings over the region 31 (pixels 301) providing the desired pattern.

Figure 3D:
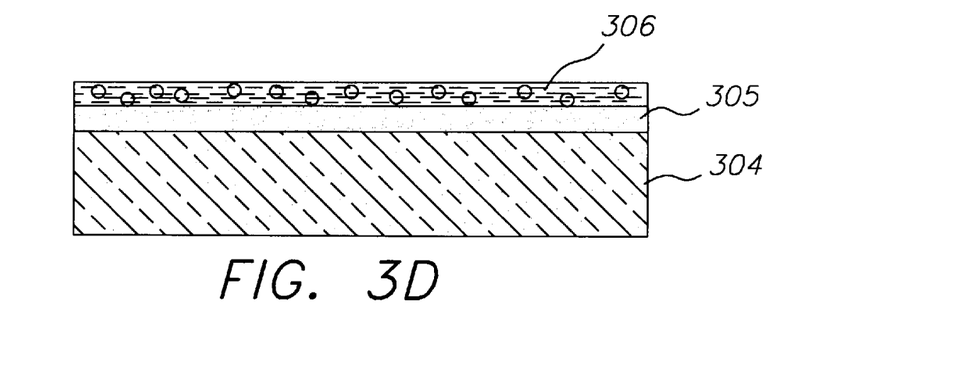

As shown in FIG. 3D, where a second substrate 304 is provided (this substrate typically is stainless steel, but other substrate materials can be used which are heat resistant) a layer 305 having a colorant is formed on the substrate 304, and another colorant layer 306 is formed on layer 305. Typically, the colorant layers are formed by physical vapor deposition, which provides uniform layers of controlled thickness, containing no materials with higher volatility than the colorants. The colorant layers 305 and 306 can be organic colorants which are transferable upon the application of energy such as heat. In a preferred embodiment of the present invention, the colorant is vaporized by heating under reduced pressure, and condensed on a moving strip of stainless steel foil which is passed over the heated source at a constant rate.

It will be appreciated that instead of using multiple colorant layers 305 and 306, a single colorant layer may be employed as discussed in the second embodiment, however the present discussion immediately below refers to the first embodiment.

Figure 3E:
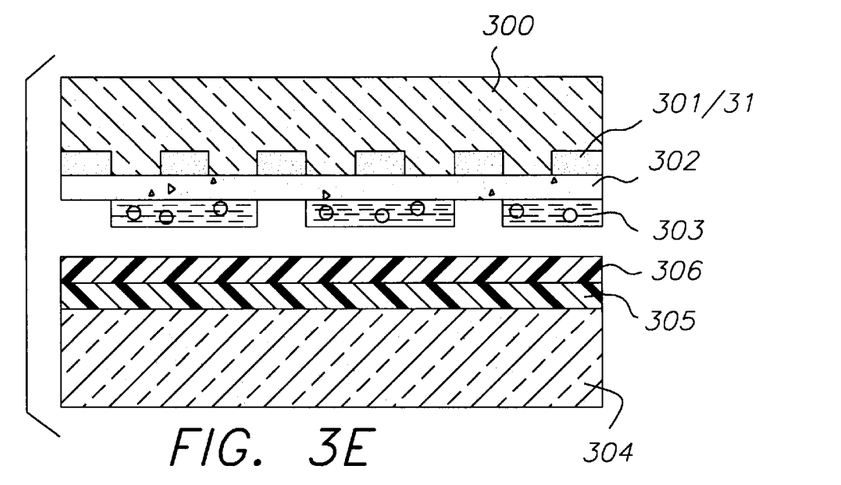

In FIG. 3E, the substrate 304 and colorant layers 305 and 306 are shown positioned relative to the substrate 300 and the regions 31 (or pixels 301) in the substrate. In the process it is desired to transfer the colorant layers 305 and 306 onto the substrate and the pixels.

Figure 3F:
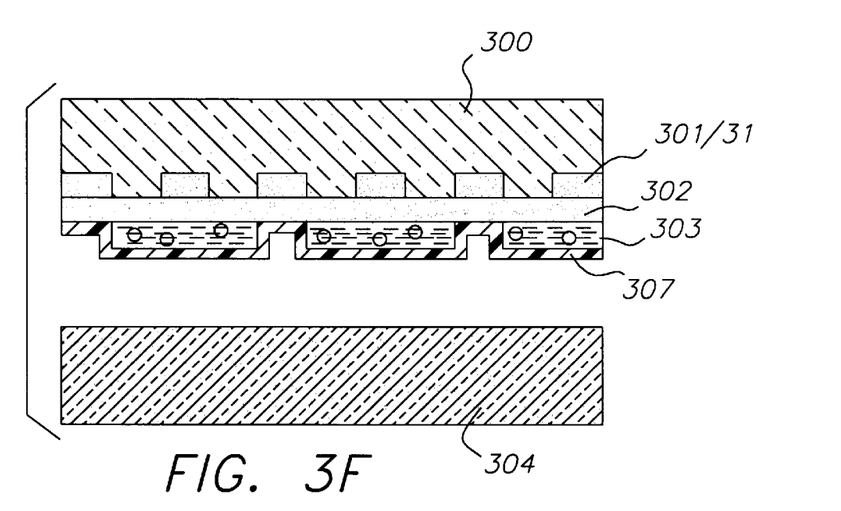

As shown in FIG. 3F, the transferred colorant layers are depicted as a single layer now labeled number 307. In order to provide this transfer, heat is applied to the substrate 304. Typically, the substrate is composed of metals, such as steel or aluminum or of a temperature-resistant plastic such as a polyimide film. Heating is often done by exposing the non-coated side of the substrate 304 to electromagnetic radiation of wavelengths which are absorbed by the substrate (or by the colorant coating in the cases where the substrate is substantially transparent) and are converted into heat by radiationless decay processes. The electromagnetic radiation may be applied over a large area simultaneously as from an extended lamp source, or it may be applied as a scanned beam as with a laser. It is appreciated that imagewise light exposure may be used to heat and transfer only a portion of the colorant coating. Another method used to heat substrate 304 in order to transfer the colorant layers 305 and 306 is to pass an electric current through the substrate, particularly when the substrate used is composed entirely or partially of metal. In still another method, the substrate may be heated by direct contact with an object such as a metal block, a high temperature roller, or other such devices which can be heated or pre-heated to the required temperature and which can transfer heat to the substrate by direct thermal contact. Typical distances and pressures for the transfer of colorant are from about 0.1 mm to about 3 mm at pressures of less than or equal to about 0.1 Torr, up to a distance of about 50 mm at pressures of less than or equal to 0.001 Torr.

Figure 3G:
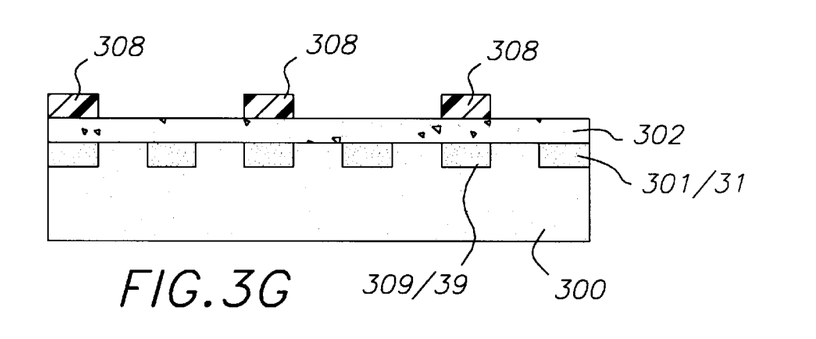

FIG. 3G shows the color filter array after a lift-off process. The lift-off process is needed to remove unwanted portions of the photoresist layer 303 and the portions of the colorant layer 307 on the unwanted portions of the photoresist layer 303, leaving behind colorant layers 38 over the selected regions 39 (or pixels 309).

More particularly, the lift-off process is as follows:

A photoresist layer is patterned by imagewise exposure to electromagnetic radiation of the appropriate wavelength followed by development to open up areas where a subsequently deposited layer is desired. The subsequent layer is deposited on both the opened areas and the remaining photoresist, followed by the lift-off, in which the photoresist is dissolved or swollen in a solvent, causing it to become detached from the underlying substrate, lifting-off to leave the desired deposit in place. A description of the lift-off process and typical materials used is given in chapter 12 of Semiconductor Lithography, by W.M. Moreau, Plenum Press, N.Y., 1989.

In order to make a color filter array with a plurality of colors, the above steps need to be repeated for each new colorant layer that is deposited over pixels.

Figure 3H:
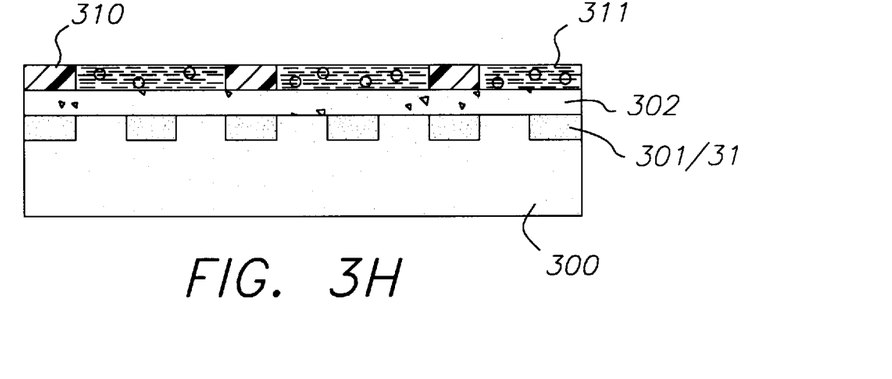

A second embodiment for the preset invention is seen viewing FIG. 3H with respect to FIG. 3F. In this embodiment the color filter is seen after a chemical mechanical polishing process. The chemical mechanical polishing process is needed to remove unwanted portions of the photoresist layer 303 and portions of layer 307 (which can be one or more colorant layers) leaving behind colorant layers 310 of the selected regions 31 (or pixels 301) and photoresist layer 311 over the remaining areas.

Figure 4A:
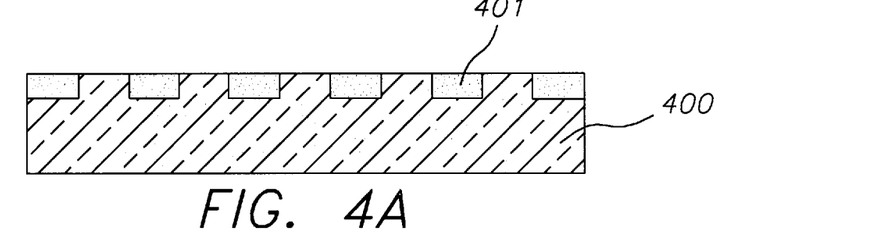
FIGS. 4A–F show various steps in another method according to the present invention for making color filter arrays.

Turning to FIG. 4A, where substrate 40 is shown, the substrate (which can be either a silicon substrate or a transparent substrate such as glass) in which are depicted regions 41 through which filtered light will pass or light that is to be filtered (regions 41 can be pixels 401 which are to receive filtered light, in the case of a silicon substrate which has already been processed to provide wells for different dopant materials (to form pixels 401). As is well understood to those skilled in the art, the substrate may be a composite of different layers, and in particular may include an adhesion promoting layer.

Figure 4B:
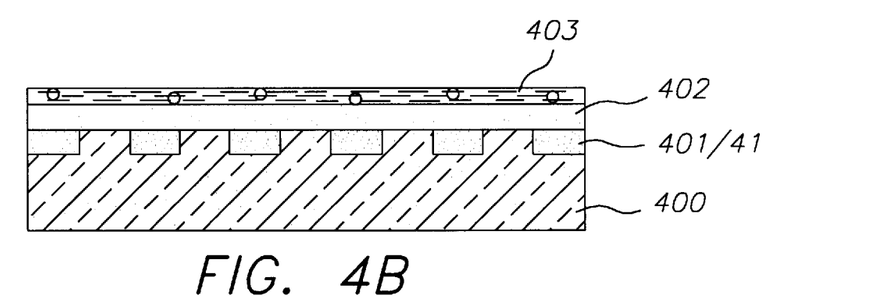

As shown in FIG. 4B, an adhesion promoting layer 402 which can be subsequently etched is formed as part of the substrate 400 with regions 41 (which can be pixels 401) and a layer of photoresist 403 is formed above it.

Figure 4C:
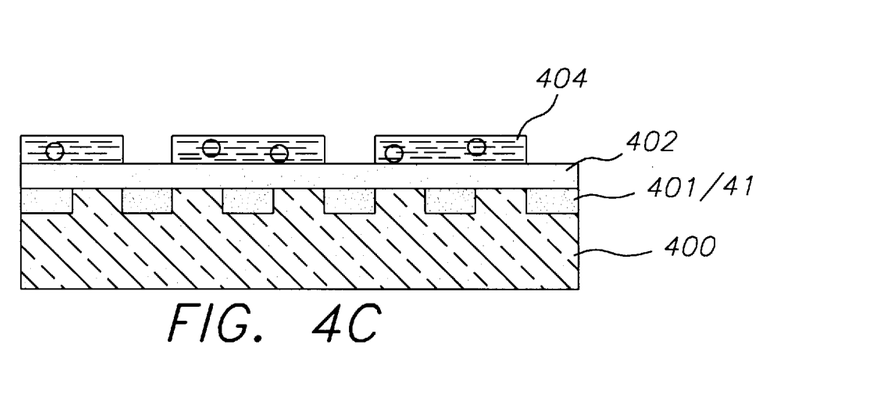

As shown in FIG. 4C, the photoresist is exposed and developed to form openings over selected regions 41 (or pixels 401), leaving photoresist 404 over the rest of the layer 402.

Figure 4D:
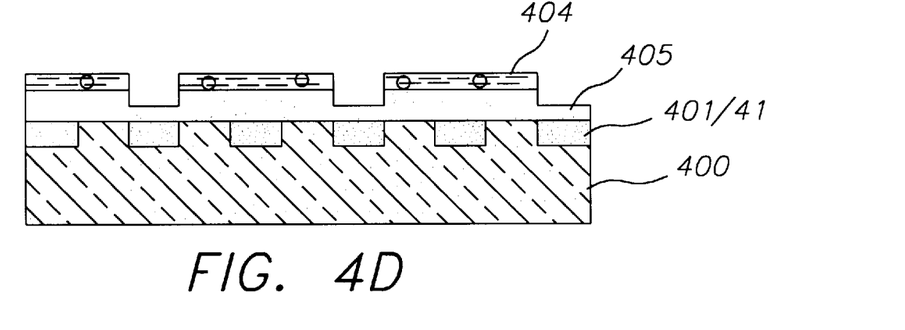

As shown in FIG. 4D, the openings in the patterned resist layer 404 are used as a mask for an etch of the substrate 400, to produce a pattern of recesses in the adhesion promoting layer, now numbered 405. Alternatively, the etch may be performed so as to etch through the adhesion promoting layer 405 into the rest of substrate 400.

Figure 4E:
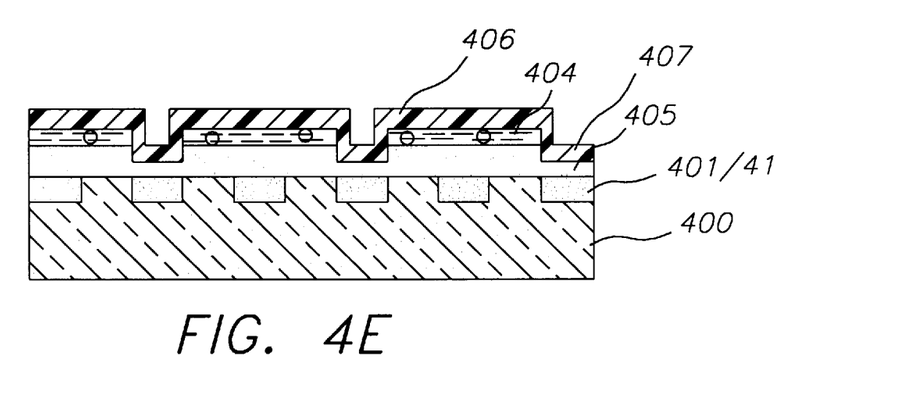

As shown in FIG. 4E, a colorant layer is deposited on the patterned resist layer 404 and the recesses in underlying layer 405 to give layer 406/407.

Figure 4F:
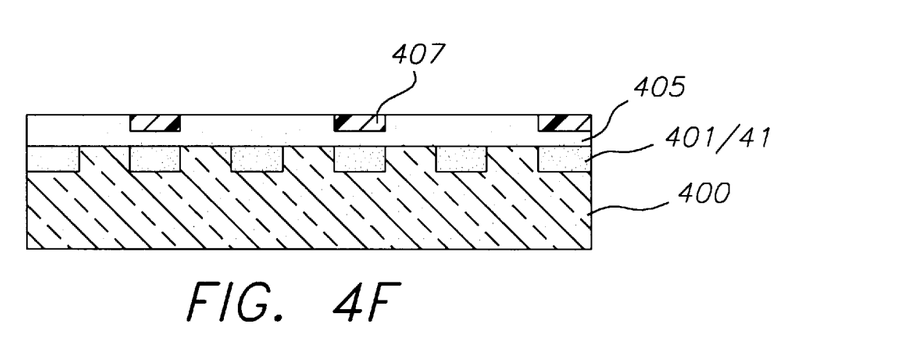

As shown in FIG. 4F, the colorant 406 which is not above the selected regions 41 (which can be pixels 401 in the case of a silicon substrate) and the patterned photoresist layer 404 is removed by chemical mechanical polishing, to leave the patterned layer 405 and the colorant 407 above the selected regions 41 (or pixels, 401).

In order to make a color filter array with a plurality of colors, the above steps need to be repeated for each new colorant layer that is deposited over subsequently selected pixels.

Figure 5A:
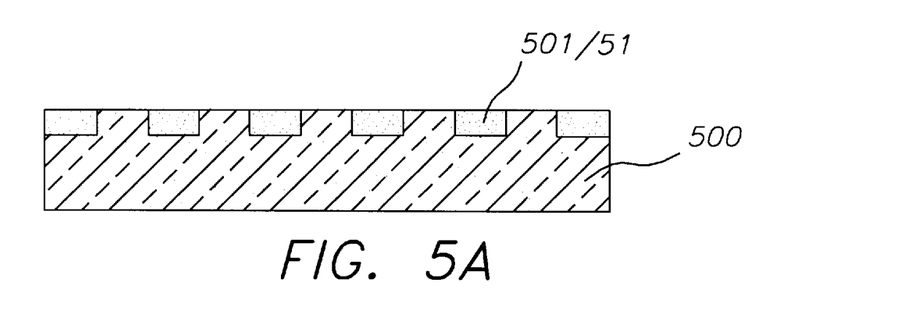
FIGS. 5A–I show various steps in another method according to the present invention for making color filter arrays.

Turning now to FIG. 5A, in which a substrate 500 (which can range from a transparent glass to a silicon based substrate) is shown having regions 51 through which filtered light will pass or light which is to be filtered. In the case where the substrate 500 is silicon, the substrate can already have been processed to provide wells for different dopant materials to form pixels 501 which are to receive filtered light. As is well understood to those skilled in the art, the substrate may be a composite of different layers, and in particular may include an adhesion promoting layer.

Figure 5B:
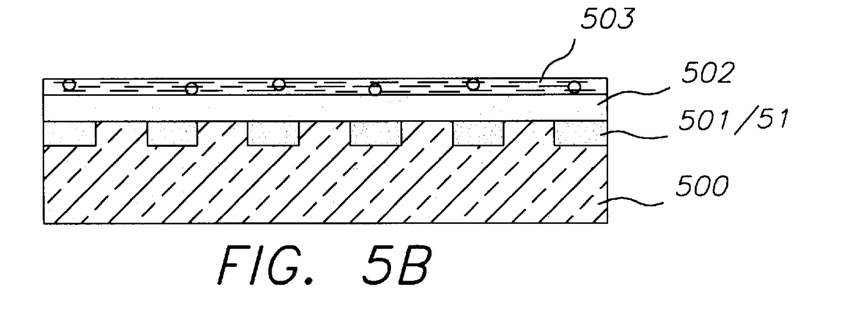

As shown in FIG. 5B, an adhesion promoting layer 52 which can be etched is formed on the substrate 50 and the regions 51 (which in the case of a silicon substrate can be pixels 501), and a photoresist layer 53 is formed above it.

Figure 5C:
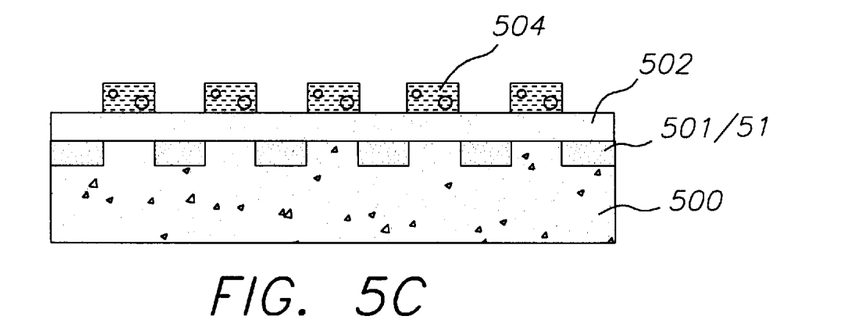

As shown in FIG. 5C, the photoresist is exposed and developed to form the patterned photoresist layer 504, having openings above the selected regions 51 (which could be pixels 501).

Figure 5D:
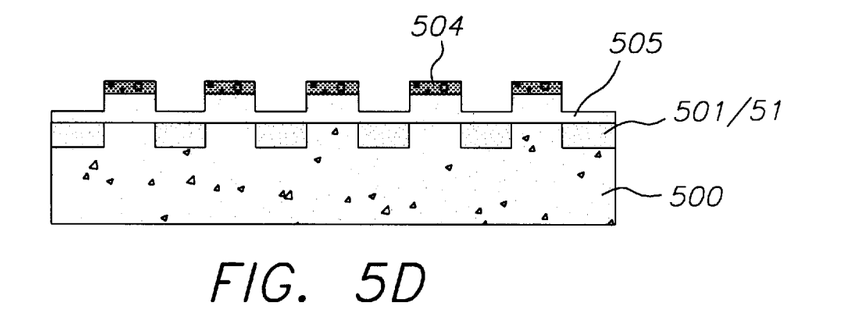

As shown in FIG. 5D, a recessed pattern is formed in the adhesion promoting layer 505 by etching through the patterned photoresist layer 504 as a mask. Alternatively, the etch may be performed so as to etch through adhesion promoting layer into the rest of the substrate.

Figure 5E:
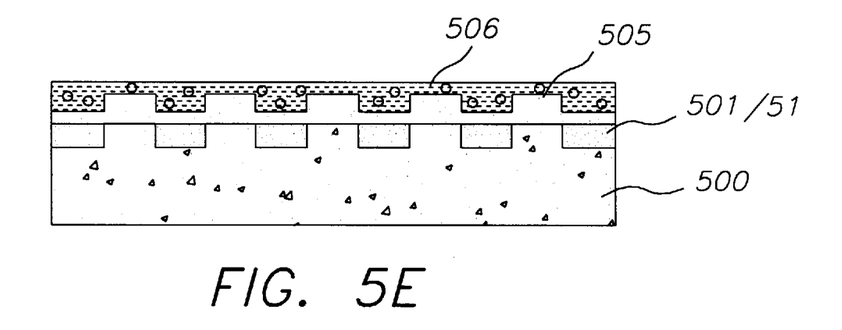

As shown in FIG. 5E, another layer of photoresist is formed on the patterned layer 505, and the two photoresist layers are shown as a single layer 506.

Figure 5F:
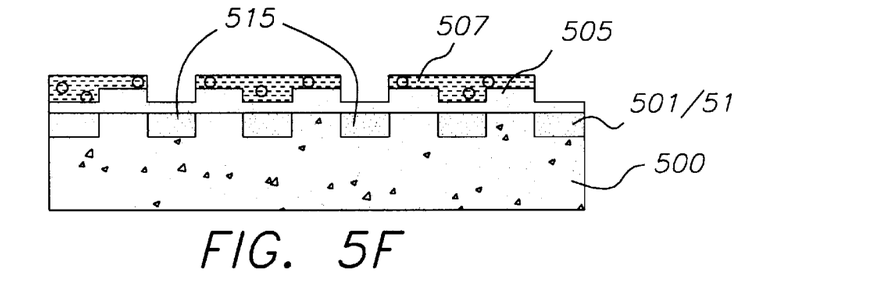

As shown in FIG. 5F, the second photoresist layer is exposed and developed to form a patterned resist layer 507, with openings above second selected regions 515.

Figure 5G:
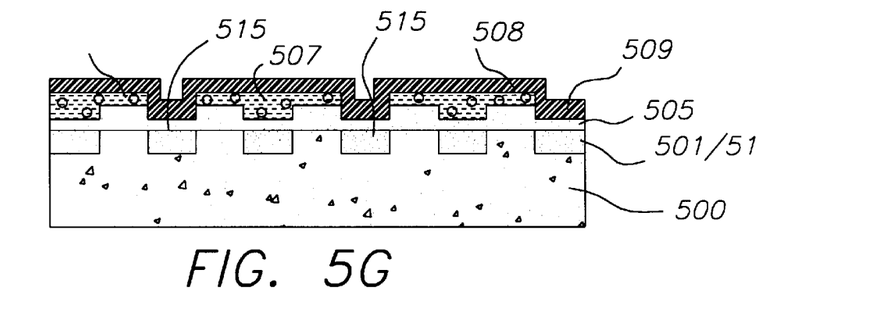

As shown in FIG. 5G, a colorant layer is deposited on the patterned resist layer 507 and above the second selected regions 515 (which is a subset of first selected regions 51 which can be pixels 501 in a silicon embodiment) to give layers 508/509.

Figure 5H:
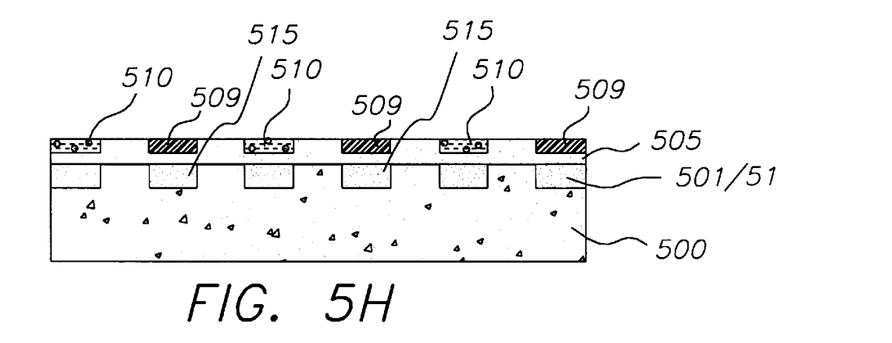

As shown in FIG. 5H, the colorant layer 508, which is not above the second selected regions 515, and the patterned photoresist layer 507 are removed to leave colorant 509 above the second selected regions 515 leaving the second photoresist 510 above the other regions. Methods for removing the colorant layer and photoresist layer include chemical mechanical polishing, to leave colorant 509 above the second selected regions 515, and photoresist 510 above the other pixels.

Figure 5I:
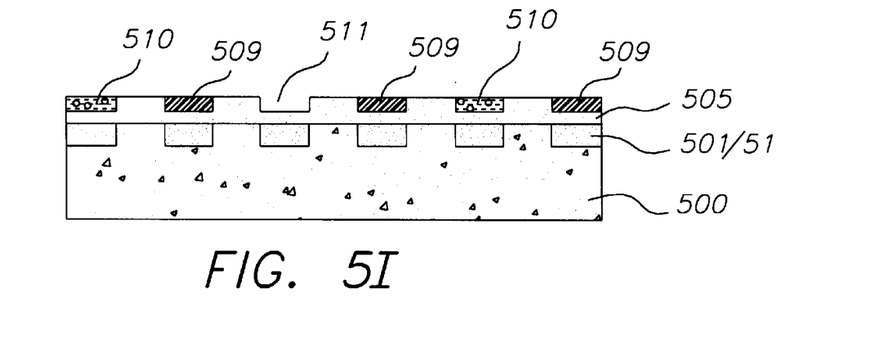

As shown in FIG. 5I, the photoresist over the regions not selected is exposed and developed to remove it from above those areas, leaving openings 511 in the etched layer 505.

In order to make a color filter array with a plurality of colors, the steps 5E–5I need to be repeated for each new color.

Colorants which are useful in the processes shown in FIGS. 3A–G, 4A–F, and 5A–I include the following: phthalocyanines, such as Pigment Blue 15, nickel phthalocyanine, chloroaluminum phthalocyanine, hydroxyaluminum phthalocyanine, vanadyl phthalocyanine, titanyl phthalocyanine, and titanyl tetrafluorophthalocyanine; isoindolinones, such as Pigment Yellow 110 and Pigment Yellow 173; isoindolines, such as Pigment Yellow 139 and Pigment Yellow 185; benzimidazolones, such as Pigment Yellow 151, Pigment Yellow 154, Pigment Yellow 175, Pigment Yellow 194, Pigment Orange 36, Pigment Orange 62, Pigment Red 175, and Pigment Red 208; quinophthalones, such as Pigment Yellow 138; quinacridones, such as Pigment Red 122, Pigment Red 202, and Pigment Violet 19; perylenes, such as Pigment Red 123, Pigment Red 149, Pigment Red 179, Pigment Red 224, and Pigment Violet 29; dioxazines, such as Pigment Violet 23; thioindigos, such as Pigment Red 88, and Pigment Violet 38; epindolidiones, such as 2,8-difluoroepindolidione; anthanthrones, such as Pigment Red 168; isoviolanthrones, such as isoviolanthrone; indanthrones, such as Pigment Blue 60; imidazobenzimidazolones, such as Pigment Yellow 192; pyrazoloquinazolones, such as Pigment Orange 67; iketopyrrolopyrroles, such as Pigment Red 254, Irgazin DPP Rubin TR, Cromophtal DPP Orange TR; Chromophtal DPP Flame Red FP (all of Ciba-Geigy); and bisaminoanthrones, such as Pigment Red 177.

The foregoing description as illustrated the two embodiments of the present invention for making color filters via close space sublimation. The first embodiment employs a lift off procedure and the second employs chemical mechanical polishing. Below is a third embodiment the details close space sublimation by colorant transfer and etch.

Figure 6A:
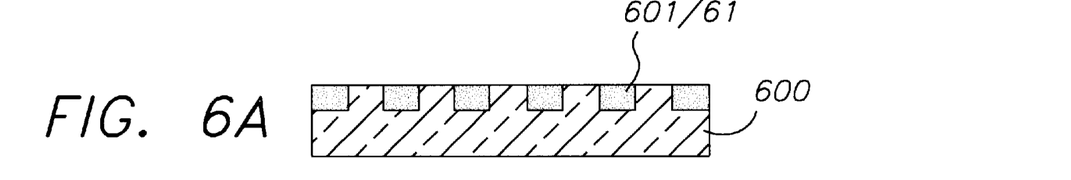
FIGS. 6A–I show various steps in another method according to the present invention for making color filter arrays.

Turning next to FIG. 6A where a substrate 600 is shown. The substrate if silicon has already been processed to provide wells for different dopant materials to form regions 601, which are pixels in the cases for a silicon substrate. If a transparent substrate is used these regions 61 will pass filtered light or light which is to be filtered, depending on the orientation of the substrate relative to the light source. As is well understood to those skilled in the art, the substrate may be a composite of different layers and in particular may include an adhesion promoting layer. For a more complete description of the construction of image sensors, see commonly assigned U.S. Pat. No. 5,235,198.

Figure 6B:
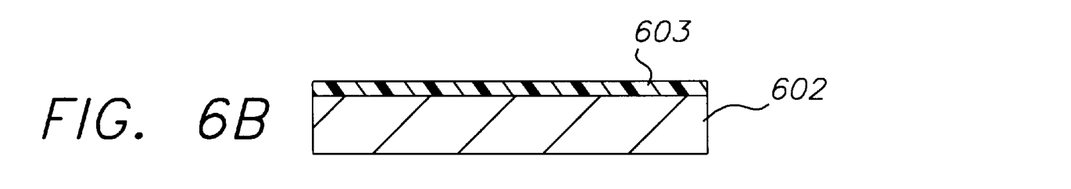

As shown in FIG. 6B, where a second substrate 602 is provided. This substrate typically is stainless steel, but other substrate materials can be used which are heat resistant. A first colorant layer 603 is formed on the substrate 602.

Figure 6C:
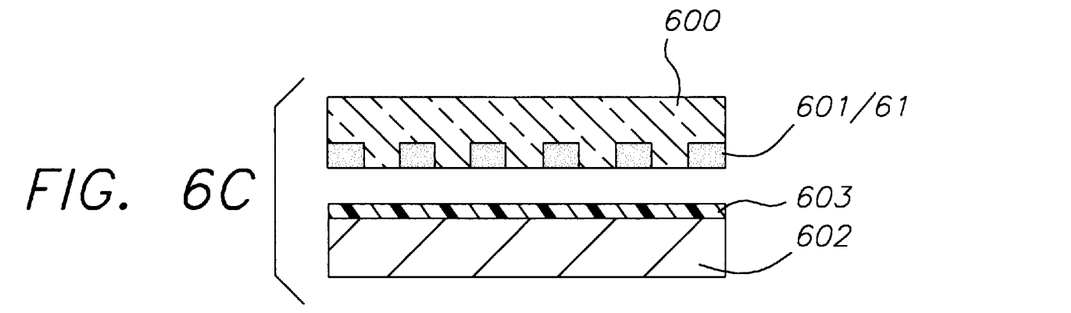

As shown in FIG. 6C, the substrate 602 and first colorant layer 603 is shown positioned relative to the substrate 600 and the regions 61 in the substrate. In the process it is desired to transfer the colorant layer 603 onto the substrate 600.

Figure 6D:
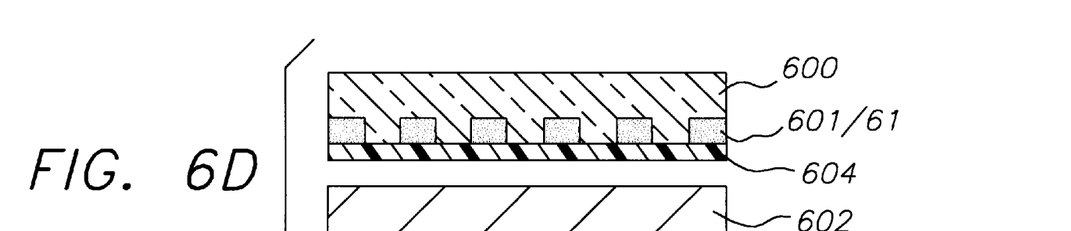

As shown in FIG. 6D, the transferred colorant layer is now labeled number 604. In order to provide this transfer, heat is applied to the substrate 602.

Figure 6E:
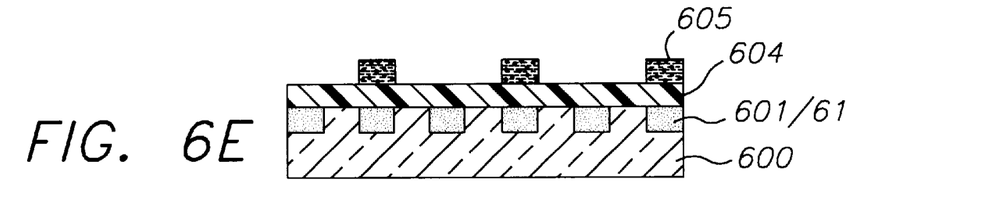

As shown in FIG. 6E, a photoresist layer 605 is formed and patterned on the first colorant layer 604 to provide protection of portions of the colorant layer over first selected regions 61. Such patterning techniques are well known to those skilled in the art. Typically, the photoresist layer 605 can be imagewise exposed to light, illuminating particular areas of the layer 605. A development step is then used to form openings in all areas except over the first selected regions 61 providing the desired pattern.

Figure 6F:
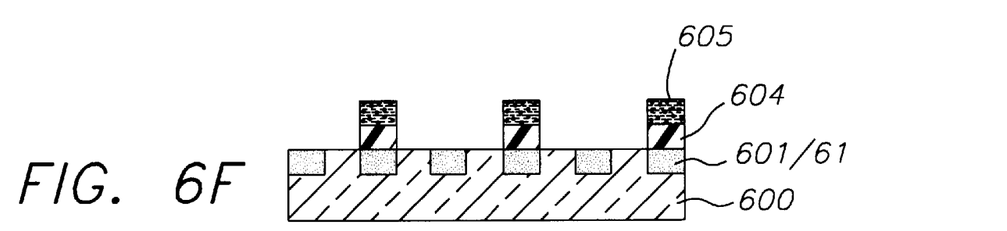

As shown in FIG. 6F, the portions of the first colorant layer 604 not covered by the photoresist 605 are removed by etching, in which the photoresist 605 acts as a mask, such that colorant is left behind only over the first selected regions 61

Figure 6G:
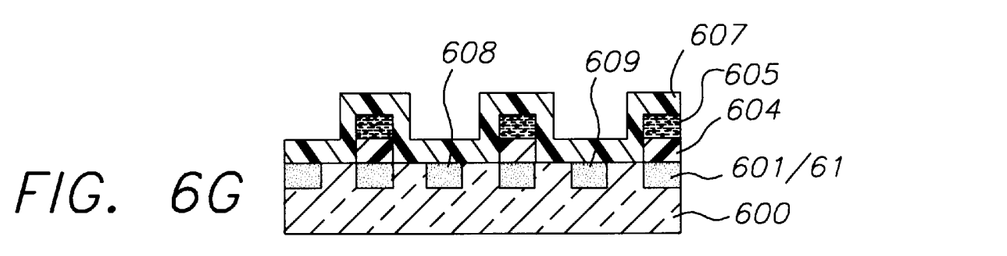

As shown in FIG. 6G, a second colorant layer 607 is deposited on the first substrate 600, over the first selected regions 61, and over the remaining regions 608 and 609. The same process is used to deposit the second colorant layer as was used to deposit the first colorant layer.

Figure 6H:
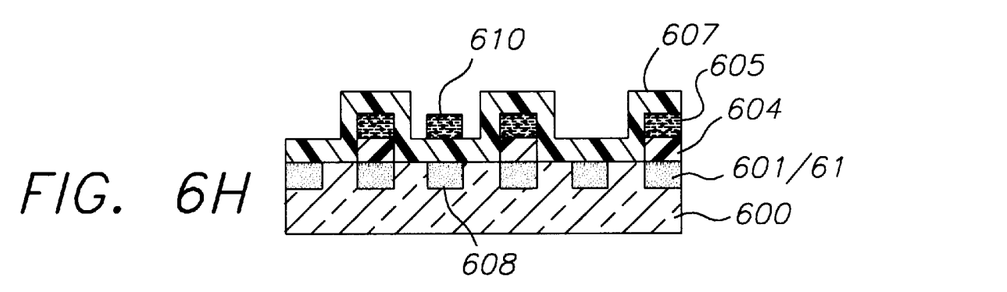

As shown in FIG. 6H, a photoresist layer 610 is formed and patterned over the second colorant layer, above second selected regions 608.

Figure 6I:
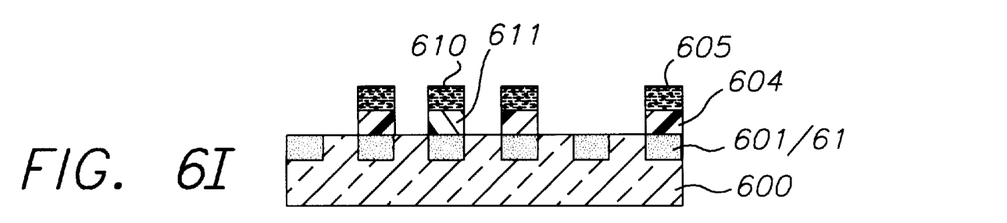

As shown in FIG. 6I, an etch step removes the second colorant layer except above the second selected regions, where it is protected by photoresist layer 608, leaving a patterned second colorant layer 611.

The steps g)–i) are repeated for each additional colorant layer desired.

Colorants which are useful in the process for the third embodiment are the same as in previously discussed. The Examples are also the same as previously described.

EXAMPLES

In accordance with the above-stated invention, the following has been performed.

Example 1

A tantalum boat was half-filled with about 0.1 gm of Pigment Yellow 110 (Ciba-Geigy Corp.), placed under a partial vacuum of about 2.5×10E-5 Torr, and heated to a temperature of 375–417 degrees C. by passing an electric current through it. The material which evaporated from the boat was condensed on a section of stainless steel foil, about 25 microns thick, maintained at ambient temperature. The thickness of the deposit was monitored by an oscillating quartz crystal monitor, and was stopped when the thickness reached about 0.45 microns.

In a similar fashion, the coated steel foil was coated with about 0.15 microns of titanyl phthalocyanine (H. W. Sands Co.), at a pressure of about 2×10E-4 Torr and over a temperature range of 331–437 degrees C.

The double-coated steel foil was positioned about 2 mm from a glass slide, clamped between two electrodes, placed in a partial vacuum of about 3.3×10E-5 Torr, and heated by the passage of an electric current at 30 volts for 10 sec. All of the colorants were found to have transferred to the glass slide, giving a clear, continuous layer with an optical density above 3.0 at 695–715 nm. Attempts to mechanically separate the transferred colorants into distinct layers were unsuccessful.

Example 2

A similar procedure was followed as given in Example 1, except that the colorants were deposited in the reverse order. The colorants transferred completely to the glass slide, and appeared to form a clear, continuous layer.

Example 3

Commercially obtained titanyl phthalocyanine (Aldrich Chemical Co.) was placed in a tantalum boat and heated by passing electrical current through it, while maintaining a reduced pressure of about 1.1×10E-4 Torr in a vacuum bell jar. About 0.15 microns of the phthalocyanine were deposited onto a section of stainless steel foil, having a thickness of about 25 microns. The coated foil was used as the substrate for a second colorant layer in a second step, heating Pigment Orange 36 (Novoperm Orange HL-70 from Hoechst Celanese Corp.) in a tantalum boat at a pressure of about 1.3×10E-4 Torr. About 0.3 microns of the pigment were deposited on the phthalocyanine coating, forming a double-layer coating on the steel foil. The double-coated foil was then mounted about 2 mm distant from a section of a silicon wafer bearing an adhesion promoting layer of 1.0 microns of poly(methyl glutarimide) (PMGI from Microelectronics Chemical Corp.) and a patterned layer of AZ5214IR photoresist (Hoechst Celanese Corp.), and the foil was clamped between two electrodes. The assembly was subjected to a vacuum of about 1.1×10E-4 Torr, and electric current was passed through the foil (at 30 volts) for about 10 sec. Both the phthalocyanine and the Pigment Orange 36 transferred to the wafer. The wafer was subjected to 30 sec. in acetone in an ultrasonic bath (Branson 2200) which removed the photoresist and the pigment which was on top of it, leaving pigment features in the desired locations on the wafer.

Example 4

Commercially obtained copper phthalocyanine was heated by passing electrical current through the tantalum boat which contained it, while maintaining a reduced pressure of approximately 6×10-5 Torr in a vacuum bell jar. About 0.2 microns of phthalocyanine were deposited onto a section of stainless steel foil, having a thickness of about 25 microns. The coated foil was then mounted about 3 mm distant from a silicon wafer which had been spin-coated with about 1 micron of poly(methyl glutarimide), "PMGI" from Microelectronics Chemical Corp., and then coated with about 1.3 microns of photoresist AZ5214IR (Hoechst Celanese Corp.) which was subsequently patterned and developed, and the non-coated side of the foil was positioned about 25 mm from an array of heat lamps (General Electric, Part no. QH500T3/CL) spaced about 30 mm apart. The assembly was subjected to a vacuum of about 6×10E-5 Torr and the heat lamps were powered for 60 seconds to transfer the phthalocyanine to the silicon wafer. The water was removed from the vacuum chamber and subjected to ultrasound in a tray of acetone for 90 seconds, using a Branson Model 3200 ultrasonic bath. The photoresist was completely removed by this treatment, leaving intact the copper phthalocyanine features in the desired pattern.

Example 5

Commercially obtained copper phthalocyanine was heated by passing electrical current through the tantalum boat which contained it, while maintaining a reduced pressure of about 6×10E-5 Torr in a vacuum bell jar. About 0.2 microns of phthalocyanine were deposited onto a section of stainless steel foil, having a thickness of about 25 microns. The coated foil was then mounted about 3 mm distant from a glass substrate, and the foil was clamped between two electrodes. The assembly was subjected to a vacuum of about 0.1 Torr, and electric current was passed through the foil (at 30 volts) for about 10 sec., causing the ends of the foil to reach a temperature of about 260 degrees C. and the phthalocyanine to transfer to the glass substrate.

The foregoing description as illustrates the embodiments most preferred for making color filters via close space sublimation. Variations of these embodiments will be readily apparent to those skilled in the art, accordingly the scope of the present invention should be measured in view of the appended claims.

Parts List

| | |
|---|---|
| 31 | regions |
| 39 | regions |
| 41 | regions |
| 51 | regions |
| 61 | regions |
| 100 | heat source |
| 102 | substrate |
| 103 | paths |
| 104 | mask |
| 105 | mask |
| 200 | second substrate |
| 201 | first substrate |
| 202 | heat sources |
| 203 | radiant heat |
| 204 | aperture |
| 205 | direction arrows |
| 300 | substrate |
| 301 | pixels |
| 302 | adhesion promoting layer |
| 303 | photoresist layer |
| 304 | substrate |
| 305 | colorant layer |
| 306 | colorant layers |
| 307 | colorant layer |
| 308 | colorant |
| 309 | pixels |
| 310 | colorant |
| 311 | photoresist |
| 400 | substrate |
| 401 | pixels |
| 402 | layer |
| 403 | photoresist |
| 404 | photoresist |
| 405 | adhesion promoting layer |
| 406 | colorant layer |
| 407 | colorant layer |
| 500 | substrate |
| 501 | pixels |
| 502 | adhesion promoting layer |
| 503 | photoresist layer |
| 504 | photoresist layer |
| 505 | adhesion promoting layer |
| 506 | photoresist layer |
| 507 | photoresist layer |
| 508 | colorant layer |
| 509 | colorant layer |
| 510 | photoresist |
| 511 | openings |
| 600 | substrate |
| 601 | pixels |
| 602 | second substrate |
| 603 | colorant layer |
| 604 | colorant layer |
| 605 | photoresist layer |
| 607 | colorant layer |
| 608 | regions |

-continued

Parts List

| | |
|---|---|
| 609 | regions |
| 610 | photoresist layer |
| 611 | colorant layer |

We claim:

1. A method of making a color filter array on a first substrate comprising the steps of:

a) depositing and patterning a photoresist layer on the first substrate to form openings over selected regions in the first substrate;

b) providing at least one heat transferable colorant layers with heat transferable colorant materials on a second substrate and positioning the second substrate such that the heat transferable colorant layers are in transferable relationship with but spaced a distance from the first substrate;

c) heating the second substrate sufficiently to cause substantially all of the heat transferable colorant materials to simultaneously transfer across the spaced distance to the patterned resist layer on the first substrate; and d) removing the patterned photoresist layer and the overlying colorant layers, leaving behind the colorant materials in the position of the openings over the selected regions.

2. The method of claim 1, wherein the removing step includes lifting off the patterned photoresist layer, leaving behind the heat transferable colorant materials in the position of the openings over the selected regions.

3. The method of claim 2, further comprising the step of repeating steps a)–d) to form color filters of different colors.

4. The method of claim 2 wherein the transferring step is done at pressures $\leq 0.1$ Torr.

5. The method of claim 2 wherein the transferring step is done at a pressure of $\leq 0.001$ Torr and a distance of $\leq 50$ mm.

6. The method of claim 2 wherein the transferring step is done at a pressure of $\leq 0.1$ Torr and at a distance of about 0.1 mm to about 3 mm.

7. The method of claim 2 wherein the colorant material is selected from the group consisting of: phthalocyanines; isoindolinones, benzimidazolones; quinophthalones; quinacridones; perylenes; dioxazines; epindolidiones; isoviolanthrones; indanthrones; imidazobenzimidazolones; pyrazoloquinazolones; diketopyrrolopyrroles; and bisaminoanthrones.

8. The method of claim 1, wherein the removing step includes chemical mechanical polishing of the colorant layer and photoresist layers, leaving behind the heat transferable colorant materials in the position of the openings over the selected regions.

9. The method of claim 8, further comprising the steps of completely removing the photoresist layer and then repeating steps a)–d) to form color filters of different colors.

10. The method of claim 8, wherein the transferring step is done at pressures $\leq 0.1$ Torr.

11. The method of claim 8 wherein the transferring step is done at a pressure of $\leq 0.001$ Torr and a distance of $\leq 50$ mm.

12. The method of claim 8 wherein the transferring step is done at a pressure of $\leq 0.1$ Torr and at a distance of about 0.1 mm to about 3 mm.

13. The method of claim 8 wherein the colorant material is selected from the group consisting of: phthalocyanines;

isoindolinones, benzimidazolones; quinophthalones; quinacridones; perylenes; dioxazines; epindolidiones; isoviolanthrones; indanthrones; imidazobenzimidazolones; pyrazoloquinazolones.

14. The method of claim 1, further comprising the step of providing an adhesion promoting layer which is formed on and is a part of the first substrate, upon which is deposited the photoresist layer.

15. The method of claim 1 further comprising the step of repeating steps a)–d) to form color filters of different colors.

16. The method of claim 1 wherein the transferring step is done at pressures $\leq 0.1$ Torr.

17. The method of claim 1 wherein the transferring step is done at a pressure of $\leq 0.001$ Torr and a distance of $\leq 50$ mm.

18. The method of claim 1 wherein the transferring step is done at a pressure of $\leq 0.1$ Torr and at a distance of about 0.1 mm to about 3 mm.

19. The method of claim 1 wherein the colorant material is selected from the group consisting of: phthalocyanines; isoindolinones, benzimidazolones; quinophthalones; quinacridones; perylenes; dioxazines; epindolidiones; isoviolanthrones; indanthrones; imidazobenzimidazolones; pyrazoloquinazolones; diketopyrrolopyrroles; and bisaminoanthrones.

20. A method of making a color filter array on a first substrate, comprising the steps of:
    a) depositing and patterning a photoresist layer on the first substrate to form openings over selected regions of the substrate;
    b) etching through the openings in the patterned photoresist layer, using it as a mask, to form a pattern of recesses in the first substrate;
    c) providing at least one transferable colorant layers having a heat transferable colorant material on a second substrate and positioning the second substrate such that the heat transferable colorant layer is in transferable relationship with, but spaced a distance from, the first substrate;
    d) heating the second substrate sufficiently to cause substantially all of the heat transferable colorant material to transfer across the spaced distance to the patterned photoresist layer on the first substrate;
    e) removing the patterned photoresist layer and overlying colorant layers, leaving behind the heat transferable colorant materials in the position of the openings over the selected regions of the first substrate.

21. The method of claim 20 wherein the removing step includes lifting off the patterned photoresist layer and overlying colorant layer, leaving behind the heat transferable colorant materials in the position of the openings over the selected regions.

22. The method of claim 20 wherein the removing step includes chemical mechanical polishing of the patterned photoresist layer and overlying colorant layer, leaving behind the heat transferable colorant materials in the position of the openings over the selected regions.

23. The method of claim 20 including providing an adhesion promoting layer which is formed on and is a part of the first substrate, upon which is deposited the photoresist layer, and which is etched in the etching step.

24. The method of claim 20 further comprising the step of repeating steps a)–e) to form color filters of different colors.

25. The method of claim 20 wherein the transferring steps are performed at pressures $\leq 0.1$ Torr.

26. The method of claim 20 wherein the transferring steps are performed at pressures $\leq 0.1$ Torr at a distance of about 0.1 mm to about 3 mm.

27. The method of claim 20 wherein the transferring steps are performed at pressures $\leq 0.001$ Torr at a distance of $\leq 50$ mm.

28. The method of claim 20 wherein the colorant material is selected from the group consisting of: phthalocyanines; isoindolinones, benzimidazolones; quinophthalones; quinacridones; perylenes; dioxazines; epindolidiones; isoviolanthrones; indanthrones; imidazobenzimidazolones; pyrazoloquinazolones; diketopyrrolopyrroles; and bisaminoanthrones.

29. A method of making a color filter array on a first substrate comprising the steps of:
    a) depositing and patterning a first photoresist layer on the first substrate to form a plurality of openings over selected regions of the first substrate;
    b) etching through the openings in the first patterned photoresist layer, using it as a mask, to form a pattern of recesses in the first substrate;
    c) depositing and patterning a second photoresist layer on the first photoresist layer to form openings over the etched recesses above second selected regions of the first substrate;
    d) providing at least one heat transferable colorant layers having heat transferable colorant materials on a second substrate and positioning the second substrate such that the heat transferable colorant layers are in transferable relationship with but spaced a distance from, the first substrate;
    e) heating the second substrate sufficiently to cause substantially all of the heat transferable colorant materials to transfer across the spaced distance to the second patterned photoresist layer on the first substrate; and
    f) removing both of the patterned photoresist layers and the overlying colorant layer, leaving behind the colorant materials in the position of the openings over the second selected pixels.

30. The method of claim 20 wherein the removing step includes lifting off the first and second patterned photoresist layers and the overlying heat transferable colorant layers, leaving behind the colorant materials in the position of the openings over the selected regions of the first substrate.

31. The method of claim 30 further comprising repeating steps c)–f) to form color filters of different colors.

32. The method of claim 30 wherein the transferring step is done at pressures $\leq 0.1$ Torr.

33. The method of claim 30 wherein the transferring step is done at a pressure of $\leq 0.001$ Torr and at a distance of $\leq 50$ mm.

34. The method of claim 30 wherein the transferring step is done at a pressure of $\leq 0.1$ Torr and at a distance of about 0.1 mm to about 3 mm.

35. The method of claim 30 wherein the colorant material is selected from the group consisting of: phthalocyanines; isoindolinones, benzimidazolones; quinophthalones; quinacridones; perylenes; dioxazines; epindolidiones; isoviolanthrones; indanthrones; imidazobenzimidazolones; pyrazoloquinazolones; diketopyrrolopyrroles; and bisaminoanthrones.

36. The method of claim 20, wherein the removing step for the first and second photoresist layers and the heat transferable colorant layer includes chemical mechanical polishing.

37. The method of claim 36 further comprising the steps of completely removing the second photoresist from the recesses not containing heat transferable colorant and then repeating steps c)–f) to form color filters of different colors.

38. The method of claim 36 wherein the transferring step is done at pressures ≦0.1 Torr.

39. The method of claim 36 wherein the transferring step is done at a pressure of ≦0.001 Torr and at a distance of ≦50 mm.

40. The method of claim 36 wherein the transferring step is done at a pressure of ≦0.1 Torr and at a distance of about 0.1 mm to about 3 mm.

41. The method of claim 36 wherein the colorant material is selected from the group consisting of: phthalocyanines; isoindolinones, benzimidazolones; quinophthalones; quinacridones; perylenes; dioxazines; epindolidi ones; isoviolanthrones; indanthrones; imidazobenzimidazolones; pyrazoloquinazolones; diketopyrrolopyrroles; and bisaminoanthrones.

42. The method of claim 20 including providing an adhesion promoting layer which is formed on and is a part of the first substrate, and which is etched in the etching step.

43. The method of claim 29 further comprising repeating steps c)–f) to form color filters of different colors.

44. The method of claim 20 wherein the transferring step is done at pressures ≦0.1 Torr.

45. The method of claim 20 wherein the transferring step is done at a pressure of ≦0.001 Torr and at a distance of ≦50 mm.

46. The method of claim 20 wherein the transferring step is done at a pressure of ≦0.1 Torr and at a distance of about 0.1 mm to about 3 mm.

47. The method of claim 20 wherein the colorant material is selected from the group consisting of: phthalocyanines; isoindolinones, benzimidazolones; quinophthalones; quinacridones; perylenes; dioxazines; epindoldiones; isoviolanthrones; indanthrones; imidazobenzimidazolones; pyrazoloquinazolones; diketopyrrolopyrroles; and bisaminoanthrones.

48. A method of making a color filter array on a first substrate comprising the steps of:

a) providing at least one heat transferable colorant layer having heat transferable colorant materials on a second substrate and positioning the second substrate such that the heat transferable colorant layers are in transferable relationship with but spaced a distance from the first substrate;

b) heating the second substrate sufficiently to cause substantially all of the heat transferable colorant materials to transfer across the spaced distance to the first substrate;

c) depositing and patterning a photoresist layer on the heat transferable colorant layers on the first substrate to form openings in the photoresist which are positioned over selected regions of the first substrate; and d) etching the heat transferable colorant layers on the first substrate through the openings in the patterned photoresist, leaving a behind a portion of the heat transferable colorant layers over the selected regions in the first substrate.

49. The method of claim 48 including providing an adhesion promoting layer on the first substrate onto which the heat transferable colorant layers are transferred.

50. The method of claim 48 further comprising repeating steps a)–d) to form color filters of different colors.

51. The method of claim 48 wherein the transferring step is performed at pressures ≦0.1 Torr.

52. The method of claim 48 wherein the transferring step is performed at pressures ≦0.1 Torr and at a distance of about 0.1 mm to about 3 mm.

53. The method of claim 48 wherein the transferring step is performed at pressures ≦0.001 Torr and at a distance of ≦50 mm.

54. The method of claim 48 wherein the transferable colorant layers further comprise a compound that is selected from the group consisting of: phthalocyanines; isoindolinones, benzimidazolones; quinophthalones; quinacridones; perylenes; dioxazines; epindolidiones; isoviolanthrones; indanthrones; imidazobenzimidazolones; pyrazoloquinazolones; diketopyrrolopyrroles; and bisaminoanthrones.

* * * * *